(12) United States Patent
Risaki

(10) Patent No.: US 9,177,954 B2
(45) Date of Patent: Nov. 3, 2015

(54) SEMICONDUCTOR DEVICE

(71) Applicant: Seiko Instruments Inc., Chiba (JP)

(72) Inventor: Tomomitsu Risaki, Chiba (JP)

(73) Assignee: SEIKO INSTRUMENTS INC. (JP)

( * ) Notice: Subject to any disclaimer, the term of this patent is extended or adjusted under 35 U.S.C. 154(b) by 0 days.

(21) Appl. No.: 13/855,781

(22) Filed: Apr. 3, 2013

(65) Prior Publication Data

US 2013/0277792 A1 Oct. 24, 2013

(30) Foreign Application Priority Data

Apr. 17, 2012 (JP) ................. 2012-094089

(51) Int. Cl.
*H01L 29/02* (2006.01)
*H01L 27/06* (2006.01)
*H01L 29/861* (2006.01)
*H01L 29/06* (2006.01)

(52) U.S. Cl.
CPC ........ *H01L 27/0676* (2013.01); *H01L 29/0692* (2013.01); *H01L 29/8611* (2013.01)

(58) Field of Classification Search
CPC .............. H01L 29/0619; H01L 29/402; H01L 29/7802; H01L 29/7395; H01L 29/0638; H01L 29/0878; H01L 29/0653; H01L 29/866; H01L 27/0629; H01L 29/0615; H01L 29/8611; H01L 29/66106; H01L 21/761; H01L 29/0623; H01L 2924/14
USPC ........... 257/E29.027, E29.257, 341, E29.013, 257/E29.198, E21.418, 339, 328, E29.066, 257/133, 342, E29.338, E29.136, E29.256, 257/E21.383, 343, E29.021, 401, 409, 475, 257/484, 487, 495, E21.375, E21.427, 257/E29.034, E29.063, E29.268, E29.335, 257/135, 139, 329, 330, 335, E21.373, 257/E21.544, E29.012, E29.184, E29.187, 257/E29.327, 146, 168, 327, 471, 476, 483, 257/490, 491, 500, 605, 606, E21.356, 257/E21.359, E21.368, E21.392, E21.696, 257/E23.119, E27.015, E27.022, E27.057, 257/E27.081, E29.014, E29.02, E29.026, 257/E29.04, E29.045, E29.118, E21.572; 438/268, 134, 197, 380, 510, 983, 167, 438/237, 270, 283, 370, 417, 478, 514, 521, 438/545, 549, 91, 965, 969
See application file for complete search history.

(56) References Cited

U.S. PATENT DOCUMENTS

| 5,654,561 | A | * | 8/1997 | Watabe | 257/139 |
| 2007/0210385 | A1 | * | 9/2007 | Ker et al. | 257/356 |
| 2010/0264491 | A1 | * | 10/2010 | Yamaji | 257/339 |
| 2011/0260246 | A1 | * | 10/2011 | Disney et al. | 257/337 |

FOREIGN PATENT DOCUMENTS

JP 11307787 11/1999

* cited by examiner

*Primary Examiner* — Su C Kim
*Assistant Examiner* — Junaiden Mirsalahuddin
(74) *Attorney, Agent, or Firm* — Adams & Wilks

(57) ABSTRACT

A semiconductor device has a semiconductor substrate and a breakdown voltage adjusting first conductivity type low concentration region provided on the semiconductor substrate. A second conductivity type high concentration region is provided near a surface within the breakdown voltage adjusting first conductivity type low concentration region so as to be surrounded by the first conductivity type low concentration region but not surrounded by any low concentration region other than the first conductivity type low concentration region. A first conductivity type high concentration region is provided on the surface within the breakdown voltage adjusting first conductivity type low concentration region without being held in contact with the second conductivity type high concentration region.

9 Claims, 6 Drawing Sheets (a)

(b)

SEMICONDUCTOR DEVICE

BACKGROUND OF THE INVENTION

1. Field of the Invention

The present invention relates to a semiconductor device. In particular, the present invention relates to a clamp diode used in a semiconductor device.

2. Description of the Related Art

A clamp diode is a device which uses a junction breakdown voltage between the p-type semiconductor and the n-type semiconductor to maintain (clamp) a voltage supplied to a circuit constant in a semiconductor device. Since a clamp diode is a device capable of limiting a voltage easily, there is a high demand and a wide usage in electronic devices.

When manufacturing a clamp diode, which limits a voltage to be constant, it is extremely important for the clamp diode to have small fluctuations in breakdown voltage within a wafer, among wafers, and among lots, and to have little change over time. In addition, it is also important for the clamp diode to have a small leakage current until breakdown occurs. Even though the structure of the clamp diode is simple, it is not easy to produce a clamp diode which satisfies all of the above-mentioned characteristics.

Japanese Published Patent Application No. 11-307787 discloses the invention for improving the above-mentioned change over time. FIG. 7 is a cross-sectional view of the structure illustrated in FIG. 1 of the Japanese Published Patent Application. There is described that, as illustrated in FIG. 7, a second conductivity type high concentration region 1 is placed away from an element isolation insulating film 2 by a predetermined distance, and further, an electrode 8 is provided through the intermediation of an insulating film 9, thereby adjusting a voltage of the electrode 8 to improve the change in the clamp diode over time. FIG. 8 is a cross-sectional view of the structure illustrated in FIG. 6 of the Japanese Published Patent Application. As shown in this structure, there is described that the same effect can be obtained even without the electrode 8 of FIG. 7.

Though the change over time can be improved by the invention disclosed in the Japanese Published Patent Application, there is no description, however, on the degree of fluctuations within a wafer, between wafers, and among lots, and the presence or absence of leakage before breakdown occurs. Indeed, in the invention disclosed in the Japanese Published Patent Application the fluctuations within a wafer, between wafers, and among lots are not reduced because of the following reasons.

Since an electric field corresponding to a voltage applied to the electrode 8 is applied to a p-n junction through the oxide film 9 in the structure illustrated in FIG. 7, the electric field is thought to be constant and the p-n junction breakdown voltage does not seem to fluctuate due to the electric field. Ideally, when the same voltage is applied to the electrodes 8, the breakdown voltages are the same. However, actually, the thicknesses of the oxide films 9 are not the same within a wafer, between wafers, and among lots, and hence the electric fields applied to the p-n junctions by the voltages of the electrodes 8 fluctuate. As a result, the p-n junction breakdown voltages fluctuate.

Further, due to the presence of a first conductivity type region 7 below the element isolation insulating film 2 of FIGS. 7 and 8, impurities in the first conductivity type region 7 affect impurity distribution near the p-n junction, and the breakdown voltage of the p-n junction changes. Also in this regard, ideally, when the first conductivity type regions 7 are produced in the same condition, the breakdown voltages of the p-n junctions are the same. Actually the concentrations of impurities in the first conductivity type regions 7, however, are not the same within a wafer, between wafers, and among lots, and the p-n junction breakdown voltages are affected to various degrees. As a result, the p-n junction breakdown voltages fluctuate.

According to the Japanese Published Patent Application No. 11-307787, a planar shape of the second conductivity type high concentration region 1 of FIG. 7 is octagon (not shown in this specification). In such a structure having corners, electric field strength is high at a corner portion, and therefore the breakdown voltage is determined by the corner portion. FIG. 9 shows the breakdown voltages in the case where the planar shape of the second conductivity type high concentration region 1 is rectangular and in the case where the planar shape thereof is circular. It is apparent that the breakdown voltage is lower in the case of the clamp diode having the rectangular second conductivity type high concentration region 1 than in the case of the clamp diode having the circular second conductivity type high concentration region 1. That is, it is apparent that the electric field is concentrated at the corner portions of the rectangle, and the corner portions determine the breakdown voltage. Ideally, the breakdown voltages of the p-n junctions will be the same since the shapes of the corner portions are always the same when lithography is performed in the same condition. Actually the electric field strength at the corner portions, however, fluctuates within a wafer, between wafers, and among lots. As a result, the p-n junction breakdown voltages fluctuate.

As described above, there are many factors that cause the breakdown voltages of the p-n junctions to fluctuate, and, in order to suppress such fluctuations, the clamp diode needs to have a structure as simple as possible, and the factors that cause fluctuations need to be eliminated as much as possible.

SUMMARY OF THE INVENTION

The present invention has been made in view of the above-mentioned problems, and the present invention provides a clamp diode which suppresses deterioration with time, fluctuations within a wafer surface, among wafers, and among lots, and leakage before breakdown.

In order to solve the above-mentioned problems, according to an exemplary embodiment of the present invention, a semiconductor device including a clamp diode includes: a breakdown voltage adjusting first conductivity type low concentration region provided on a semiconductor substrate; a second conductivity type high concentration region provided within the breakdown voltage adjusting first conductivity type low concentration region, the second conductivity type high concentration region being circular; an element isolation insulating film provided within the breakdown voltage adjusting first conductivity type low concentration region, the element isolation insulating film being provided in a ring shape and surrounding the second conductivity type high concentration region without being held in contact therewith; and a first conductivity type high concentration region provided outside the ring of the element isolation insulating film within the breakdown voltage adjusting first conductivity type low concentration region.

By the foregoing arrangement, the present invention provides a clamp diode having little deterioration with time, small fluctuations within a wafer surface, among wafers, and among lots, and little leakage before breakdown.

DETAILED DESCRIPTION OF THE PREFERRED EMBODIMENTS

A mode for carrying out the present invention is described below with reference to the attached drawings.

Figure 1A:
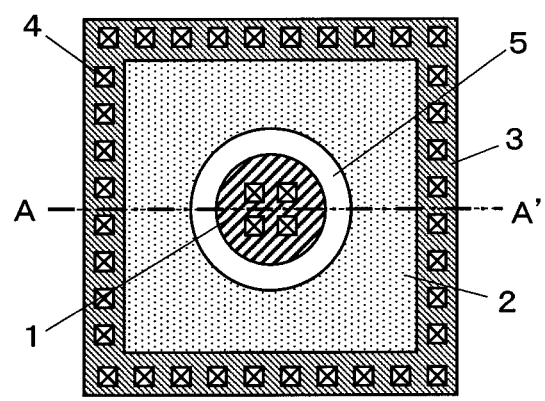
FIGS. 1A and 1B are diagrams illustrating a representative example of the present invention.
Figure 1B:
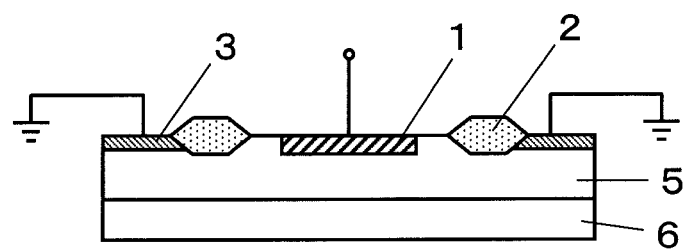

FIGS. 1A and 1B are diagrams illustrating a clamp diode in a semiconductor device according to a first embodiment of the present invention. FIG. 1A is a plan view, and FIG. 1B is a cross-sectional view along the line A-A' of FIG. 1A.

A breakdown voltage adjusting first conductivity type low concentration region 5 is provided on a surface of a semiconductor substrate 6, and a second conductivity type high concentration region 1, which has a conductivity type opposite to that of the breakdown voltage adjusting first conductivity type low concentration region 5, is provided on a part of a surface of the breakdown voltage adjusting first conductivity type low concentration region 5 so as to be circular in a plan view. On the surface of the breakdown voltage adjusting first conductivity type low concentration region 5, an element isolation insulating film 2 having a ring shape is provided in such a way that the element isolation insulating film 2 surrounds the second conductivity type high concentration region 1 without being held in contact therewith. The ring shape as used herein does not necessarily mean an annular shape or a doughnut shape, and an inner part of the ring shape of the element isolation insulating film 2 is circular, but an outer shape thereof is rectangular in this embodiment. Further, on the breakdown voltage adjusting first conductivity type low concentration region 5, a rectangular first conductivity type high concentration region 3 is provided so as to surround the element isolation insulating film 2. The second conductivity type high concentration region 1 and the first conductivity type high concentration region 3 have surfaces covered with insulating films, and are respectively connected to different wirings via contacts 4.

When a voltage is applied between the first conductivity type high concentration region 3 and the second conductivity type high concentration region 1, due to breakdown of a p-n junction of the second conductivity type high concentration region 1 and the breakdown voltage adjusting first conductivity type low concentration region 5, the voltage is clamped to be a constant voltage. Depending on the purposes, the semiconductor device may include only a clamp diode, or may include a circuit having components other than the clamp diode, such as a transistor.

<Effect 1>

Figure 2:
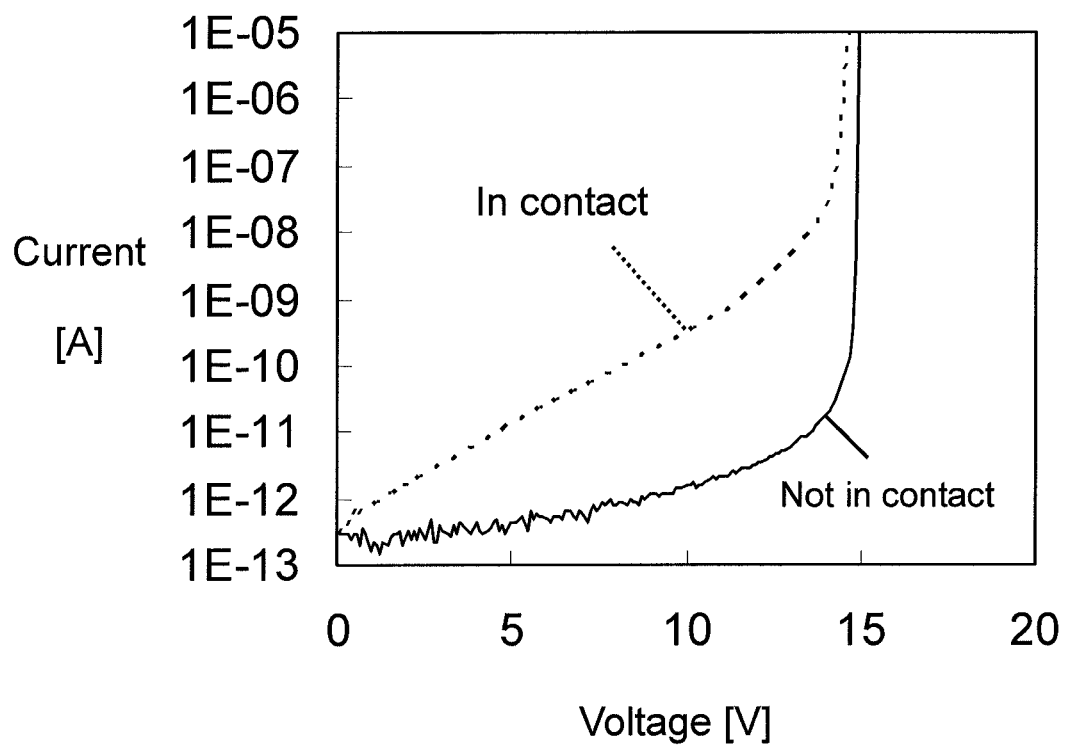
FIG. 2 is a graph showing leakage characteristics of a clamp diode.

As illustrated in FIGS. 1A and 1B of the present invention, the second conductivity type high concentration region 1 is provided without being held in contact with the element isolation insulating film 2, and hence the inventor(s) of the present invention have found that there can be obtained not only an effect of suppressing deterioration with time as described in Japanese Patent Application Laid-open No. Hei 11-307787 but also an effect of suppressing a leakage current at a voltage equal to or lower than a breakdown voltage of the p-n junction. FIG. 2 is a graph showing voltage-current characteristics of the clamp diode. "Not in contact" in the graph of FIG. 2 refers to a structure in which the second conductivity type high concentration region 1 and the element isolation insulating film 2 are not held in contact with each other as illustrated in FIGS. 1A and 1B, and "in contact" refers to a structure in which the second conductivity type high concentration region 1 and the element isolation insulating film 2 are in contact with each other. As shown in FIG. 2, the structure in which the second conductivity type high concentration region 1 and the element isolation insulating film 2 are "not in contact" with each other has a smaller leakage current than the structure in which the second conductivity type high concentration region 1 and the element isolation insulating film 2 are "in contact" with each other. The inventor(s) of the present invention have assumed the reason for this to be as follows. When forming the element isolation insulating film 2 held in contact with the second conductivity type high concentration region 1, a distortion is generated between the element isolation insulating film 2 and the breakdown voltage adjusting first conductivity type low concentration region 5, and a level is formed in a forbidden band of the breakdown voltage adjusting first conductivity type low concentration region 5. As a result, a current flows through the level, and hence a leakage current is large in the structure in which the second conductivity type high concentration region 1 and the element isolation insulating film 2 are held in contact with each other.

Accordingly, in FIGS. 1A and 1B of the present invention, together with the effect of suppressing deterioration with time described in the Japanese Published Patent Application No. 11-307787, the effect of suppressing a leakage current can be obtained, which is one of the objects of the present invention.

<Effect 2>

Figure 7:
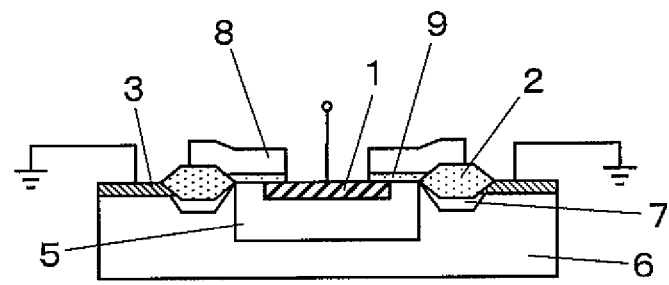
FIG. 7 is a diagram illustrating an embodiment of the conventional technology.

In FIGS. 1A and 1B of the present invention, there is no electrode 8 or insulating film 9 of the conventional structure illustrated in FIG. 7, and hence there is no fluctuation in an electric field propagating from the electrode 8 to a p-n junction breakdown voltage, which is one of the objects of the present invention. As a result, a fluctuation in the p-n junction breakdown voltage is reduced.

<Effect 3>

Figure 8:
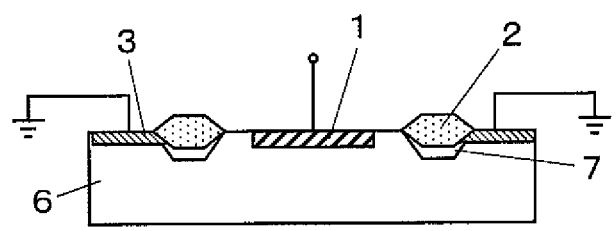
FIG. 8 is a diagram illustrating another embodiment of the conventional technology.
Figure 9:
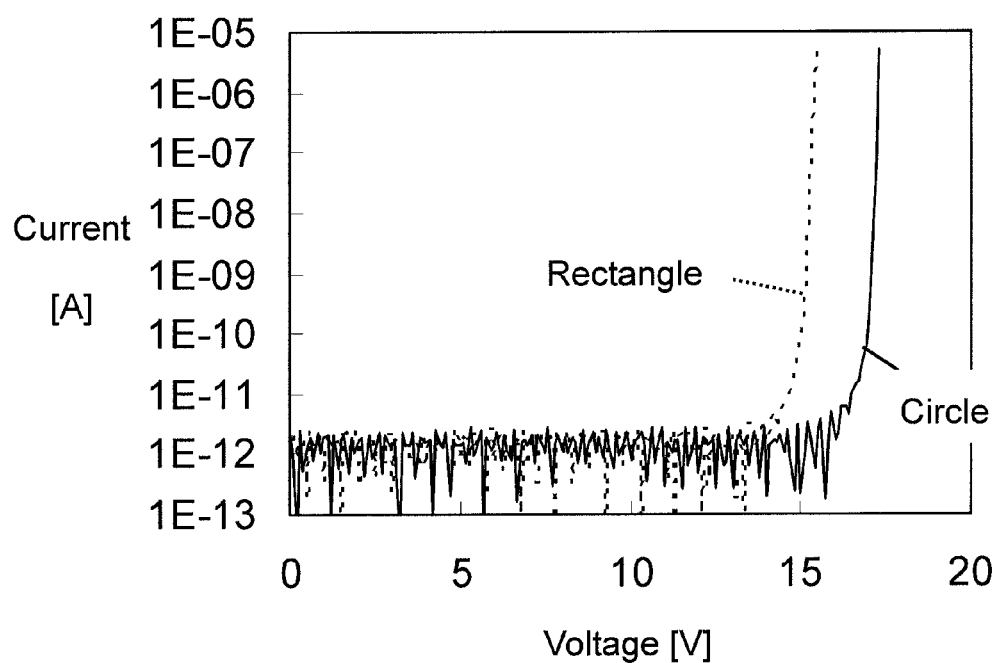
FIG. 9 is a graph showing shape dependence of a second conductivity type high concentration region on a current-voltage characteristic of the clamp diode.

In FIGS. 1A and 1B of the present invention, there is no first conductivity type region 7 of the conventional structure illustrated in FIGS. 7 and 8, and hence the p-n junction breakdown voltage is not affected by the first conductivity type region 7 to various degrees, which is one of the objects of the present invention. As a result, a fluctuation in the p-n junction breakdown voltage is further reduced along with Effect 2.

<Effect 4>

In FIGS. 1A and 1B of the present invention, a planar shape of the second conductivity type high concentration region 1 is circular and has no corner, and hence there is no fluctuation in electric field strength due to fluctuations in corner portions of the second conductivity type high concentration region 1, which is one of the objects of the present invention. As a result, a fluctuation in the p-n junction breakdown voltage is further reduced along with Effects 2 and 3.

Modified Example 1

Figure 3:
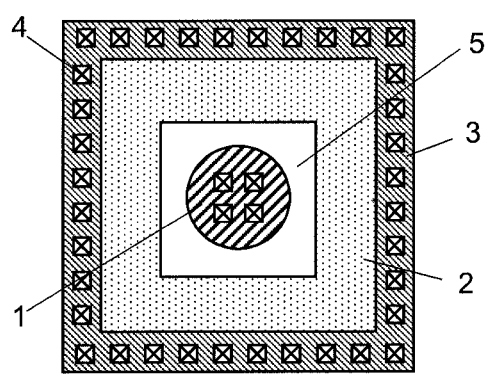
FIG. 3 is a diagram illustrating Modified Example 1 of the present invention.

FIG. 3 is a plan view illustrating Modified Example 1 of the present invention. FIG. 3 illustrates a case where a planar shape of a part of the element isolation insulating film 2 on the second conductivity type high concentration region 1 side is rectangular. When the element isolation insulating film 2 is not held in contact with the second conductivity type high concentration region 1 as in this case, even if the planar shape of the element isolation insulating film 2 is not a circle as illustrated in FIGS. 1A and 1B, but a rectangle, a hexagon, or the like, the above-mentioned Effects 1 to 4 can be obtained.

Modified Example 2

Figure 4A:
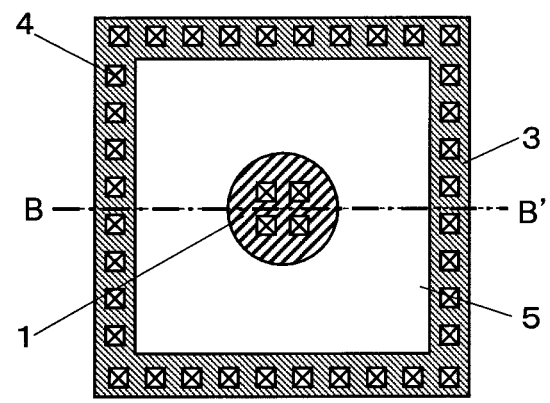
FIGS. 4A and 4B are diagrams illustrating Modified Example 2 of the present invention.
Figure 4B:
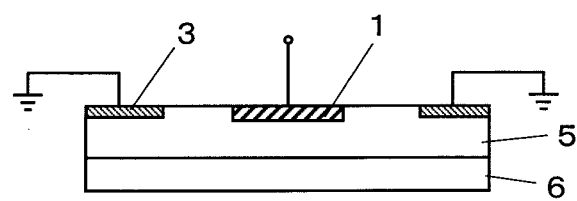

FIG. 4A is a plan view illustrating Modified Example 2 of the present invention, and FIG. 4B is a cross-sectional view along the line B-B' of FIG. 4A. In an example illustrated in FIGS. 4A and 4B, there is no element isolation insulating film 2 illustrated in FIG. 3. In this way, even when there is no element isolation insulating film 2, the above-mentioned Effects 1 to 4 can be obtained.

Modified Example 3

In FIGS. 1A and 1B, FIG. 3, and FIGS. 4A and 4B, the first conductivity type high concentration region 3 is disposed in a rectangular ring shape. Even when the first conductivity type high concentration region 3 has a shape other than a rectangle, or even when the first conductivity type high concentration region 3 does not have a ring shape, the above-mentioned Effects 1 to 4 can be obtained.

Modified Example 4

In order to clamp a voltage in any current band at the same voltage, the clamp diode is required to have steep breakdown characteristics. In order to obtain the steep breakdown characteristics, a parasitic resistance may be reduced. In the present invention, the distance between the second conductivity type high concentration region 1 and the first conductivity type high concentration region 3 is short, and a parasitic resistance of the breakdown voltage adjusting first conductivity type low concentration region 5 is reduced, thereby obtaining the steep breakdown characteristics.

Figure 5A:
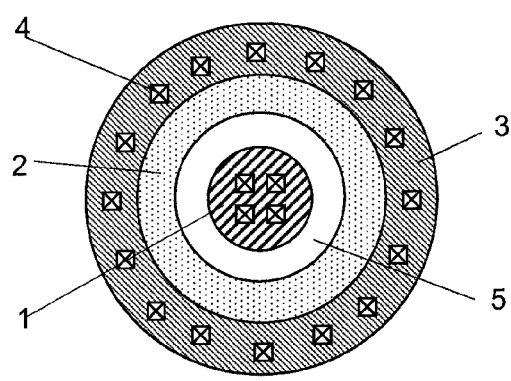
FIGS. 5A and 5B are diagrams illustrating Modified Example 4 of the present invention.
Figure 5B:
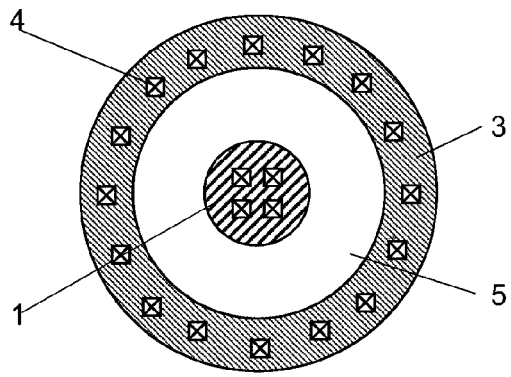

FIG. 5A is a plan view illustrating another clamp diode of FIGS. 1A and 1B, in which the parasitic resistance of the breakdown voltage adjusting first conductivity type low concentration region 5 is reduced as much as possible. FIG. 5B is a plan view illustrating another clamp diode of FIGS. 4A and 4B, in which the parasitic resistance of the breakdown voltage adjusting first conductivity type low concentration region 5 is reduced as much as possible.

As illustrated in FIGS. 5A and 5B, the ring shapes of the element isolation insulating film 2 and the first conductivity type high concentration region 3 are all set to be annular shapes of circles, and each size thereof is set to be a minimum value of the design rule. In this way, the parasitic resistance of the breakdown voltage adjusting first conductivity type low concentration region 5 can be reduced as much as possible and it is possible to obtain the steepest breakdown characteristics.

Modified Example 5

Figure 6A:
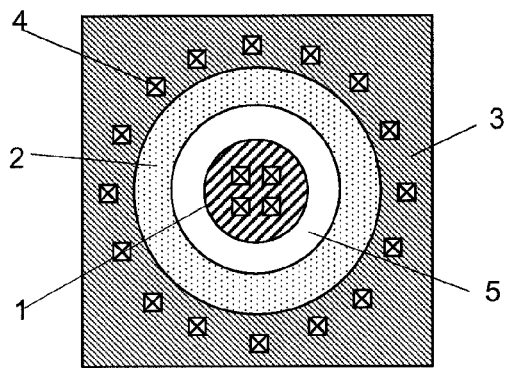
FIGS. 6A and 6B are diagrams illustrating Modified Example 5 of the present invention.
Figure 6B:
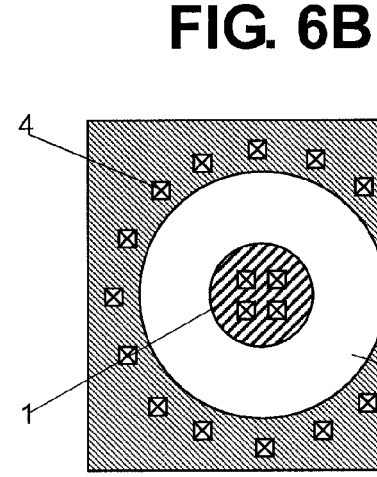

FIGS. 6A and 6B are plan views respectively illustrating modified clamp diodes of FIGS. 5A and 5B. Even when outer parts of the ring shapes of the first conductivity type high concentration regions 3 have shapes other than a circle as in this case, the parasitic resistances of the breakdown voltage adjusting first conductivity type low concentration regions 5 are the same as those in the case of FIGS. 5A and 5B, and therefore the same effect as that in Modified Example 4 can be obtained.

Modified Example 6

In all of the above-mentioned exemplary embodiments of the present invention, the element isolation insulating film 2 is assumed to be formed by LOCOS. However, even when the element isolation insulating film 2 is formed by shallow trench isolation (STI), the same effect can be obtained. In this manner, the present invention is not limited to the above-mentioned embodiments, and can be modified within the scope of the present invention without departing from the gist thereof.

What is claimed is:

1. A semiconductor device, comprising:
   a semiconductor substrate;
   a breakdown voltage adjusting first conductivity type low concentration region provided on the semiconductor substrate;
   a second conductivity type high concentration region provided near a surface within the breakdown voltage adjusting first conductivity type low concentration region so as to be surrounded by the first conductivity type low concentration region but not surrounded by any low concentration region other than the first conductivity type low concentration region, the second conductivity type high concentration region being circular;
   an element isolation insulating film provided on the surface within the breakdown voltage adjusting first conductivity type low concentration region, the element isolation insulating film having a ring shape and surrounding the second conductivity type high concentration region without being held in contact therewith; and
   a first conductivity type high concentration region provided on the surface within the breakdown voltage adjusting first conductivity type low concentration region without being held in contact with the second conductivity type high concentration region; and
   an element isolation insulating film provided on the surface within the breakdown voltage adjusting first conductivity type low concentration region, the element isolation insulating film having a ring shape and surrounding the second conductivity type high concentration region without being held in contact therewith.

2. A semiconductor device according to claim 1, wherein the first conductivity type high concentration region has a ring shape and is provided so as to surround the second conductivity type high concentration region.

3. A semiconductor device according to claim 2, wherein at least an inner part of the ring shape of the first conductivity type high concentration region is circular.

4. A semiconductor device, comprising:
   a semiconductor substrate;
   a breakdown voltage adjusting first conductivity type low concentration region provided on the semiconductor substrate;

a second conductivity type high concentration region provided near a surface within the breakdown voltage adjusting first conductivity type low concentration region, the second conductivity type high concentration region being circular;

a first conductivity type high concentration region provided on the surface within the breakdown voltage adjusting first conductivity type low concentration region without being held in contact with the second conductivity type high concentration region; and an element isolation insulating film provided on the surface within the breakdown voltage adjusting first conductivity type low concentration region, the element isolation insulating film having a ring shape and surrounding the second conductivity type high concentration region without being held in contact therewith.

5. A semiconductor device according to claim 4, wherein the first conductivity type high concentration region has a ring shape and is provided so as to surround the element isolation insulating film.

6. A semiconductor device according to claim 5, wherein:
the ring shape of the element isolation insulating film comprises an annular shape; and
at least an inner part of the ring shape of the first conductivity type high concentration region is circular.

7. A semiconductor device, comprising:
a semiconductor substrate;
a first conductivity type low concentration region provided on the semiconductor substrate;
a second conductivity type high concentration region provided near a surface within the first conductivity type low concentration region;
a first conductivity type high concentration region provided on the surface within the first conductivity type low concentration region without being held in contact with the second conductivity type high concentration region, the first conductivity type high concentration region and the second conductivity type high concentration region being separated from one another by a portion of the first conductivity type low concentration region disposed therebetween and in which a trench structure does not surround the second conductivity type high concentration region; and an element isolation insulating film provided on the surface within the first conductivity type low concentration region, the element isolation insulating film having a ring shape and surrounding the second conductivity type high concentration region without being held in contact therewith.

8. A semiconductor device according to claim 7, wherein the first conductivity type high concentration region has a ring shape and is provided so as to surround the element isolation insulating film.

9. A semiconductor device according to claim 8, wherein:
the ring shape of the element isolation insulating film comprises an annular shape; and
at least an inner part of the ring shape of the first conductivity type high concentration region is circular.

* * * * *